United States Patent
Kim (10) Patent No.: US 8,030,653 B2
(45) Date of Patent: Oct. 4, 2011

(54) IMAGE SENSOR AND METHOD FOR MANUFACTURING THE SAME

(75) Inventor: Hag-Dong Kim, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 348 days.

(21) Appl. No.: 12/330,631

(22) Filed: Dec. 9, 2008

(65) Prior Publication Data

US 2009/0152603 A1    Jun. 18, 2009

(30) Foreign Application Priority Data

Dec. 14, 2007  (KR) .................. 10-2007-0130645

(51) Int. Cl.
*H01L 29/04* (2006.01)

(52) U.S. Cl. ...... 257/59; 257/72; 257/233; 257/E25.032; 257/E27.131; 438/73; 438/478; 438/491

(58) Field of Classification Search .................. None
See application file for complete search history.

(56) References Cited

U.S. PATENT DOCUMENTS

| 4,746,620 | A | * | 5/1988 | Diadiuk et al. ............. 438/93 |
| 2006/0199296 | A1 | | 9/2006 | Sekiguchi et al. |
| 2008/0093695 | A1 | * | 4/2008 | Gao et al. ................. 257/428 |
| 2009/0065828 | A1 | * | 3/2009 | Hwang .................... 257/292 |

FOREIGN PATENT DOCUMENTS

KR    10-2006-0022670    3/2006

* cited by examiner

*Primary Examiner* — Evan Pert
*Assistant Examiner* — Scott R Wilson
(74) *Attorney, Agent, or Firm* — Sherr & Vaughn, PLLC (57) ABSTRACT

Embodiments relate to an image sensor that may include transistors, a first dielectric, a crystalline semiconductor layer on and/or over the first dielectric, a photodiode, a dummy region, via contacts, and a second dielectric. A photodiode may be formed by implanting impurity ions into a crystalline semiconductor layer to correspond the pixel region. A dummy region may be formed in the crystalline semiconductor layer excepting a region for the photodiode. Via contacts may penetrate the dummy region, and may be connected to the first metal interconnections. A second dielectric may include a plurality of second metal interconnections on and/or over the crystalline semiconductor layer. The plurality of second metal interconnections may electrically connect the via contacts to the photodiode.

18 Claims, 5 Drawing Sheets

IMAGE SENSOR AND METHOD FOR MANUFACTURING THE SAME

The present application claims priority under 35 U.S.C. 119 to Korean Patent Application No. 10-2007-0130645 (filed on Dec. 14, 2007), which is hereby incorporated by reference in its entirety.

BACKGROUND

An image sensor may be a semiconductor device that may convert an optical image into an electric signal. An image sensor may be classified as at least one of a charge coupled device (CCD) image sensor and a complementary metal oxide silicon (CMOS) image sensor (CIS).

A CIS may include a photodiode and a MOS transistor formed in a unit pixel, and may obtain an image by sequentially detecting electrical signals of unit pixels in a switching manner. In a CIS, a photodiode region may convert a light signal to an electrical signal, and a transistor may process the electrical signal. A photodiode region and a transistor may be horizontally arranged on and/or over a semiconductor substrate. In a horizontal type CIS according to the related art, a photodiode and a transistor may be horizontally formed adjacent to each other on and/or over a substrate. Therefore, an additional region for forming a photodiode may be required.

SUMMARY

Embodiments relate to an image sensor and a manufacturing method thereof that may use a vertical type photodiode, which may enhance a degree of integration of a device.

According to embodiments, an image sensor may include at least one of the following. Transistors on and/or over a pixel region of a first substrate. A first dielectric on and/or over the first substrate, the first dielectric including first metal interconnections connected to the transistors, respectively. A crystalline semiconductor layer on and/or over the first dielectric. A photodiode formed by implanting impurity ions into the crystalline semiconductor layer to correspond the pixel region. A dummy region in the crystalline semiconductor layer excepting a region for the photodiode. Via contacts penetrating the dummy region, and connected to the first metal interconnections. A second dielectric including a plurality of second metal interconnections over the crystalline semiconductor layer, the plurality of second metal interconnections electrically connecting the via contacts to the photodiode.

According to embodiments, a method for manufacturing an image sensor may include at least one of the following. Forming transistors on and/or over a pixel region of a first substrate. Forming a first dielectric including first metal interconnections on and/or over the first substrate, the first metal interconnections being connected to the transistors, respectively. Preparing a second substrate including a crystalline semiconductor layer. Selectively implanting impurity ions into the crystalline semiconductor layer to form a photodiode in one portion of the crystalline semiconductor layer corresponding to the pixel region, and to form a dummy region in the other portion of the crystalline semiconductor layer. Bonding the first and second substrates to each other. Separating the second substrate from the crystalline semiconductor layer to leave the crystalline semiconductor layer remaining on the first substrate. Forming via contacts that may penetrate the dummy region and may be connected to the first metal interconnections. Forming a second dielectric including a plurality of second metal interconnections on and/or over the crystalline semiconductor layer, the plurality of second metal interconnections electrically connecting the via contacts to the photodiode.

Embodiments relate to a device that may include at least one of the following: at least one transistor over a pixel region of a first substrate; a first dielectric over the first substrate, the first dielectric including at least one first metal interconnection connected to the at least one transistor, respectively; a crystalline semiconductor layer over the first dielectric; a photodiode in the crystalline semiconductor layer formed in a region corresponding to the pixel region; a dummy region in the crystalline semiconductor layer excepting the region of the photodiode; at least one via contact penetrating the dummy region, and connected to the at least one first metal interconnection; and a second dielectric including at least one second metal interconnection over the crystalline semiconductor layer such that the at least one second metal interconnection electrically connects the at least one via contact to the photodiode.

Embodiments relate to a device that may include at least one of the following: forming a transistor over a pixel region of a first substrate; forming a first dielectric including a first metal interconnection over the first substrate, the first metal interconnection being connected to the transistor; forming a crystalline semiconductor layer over the first dielectric; selectively implanting impurity ions into the crystalline semiconductor layer to form a photodiode in a first portion of the crystalline semiconductor layer corresponding to the pixel region, and to form a dummy region in a second portion of the crystalline semiconductor layer not corresponding to the pixel region; forming a via contact that penetrates the dummy region and is connected to the first metal interconnection; and then forming a second dielectric including a second metal interconnection over the crystalline semiconductor layer, the second metal interconnection electrically connecting the via contact to the photodiode.

DRAWINGS

Example

DESCRIPTION

Figure 10:
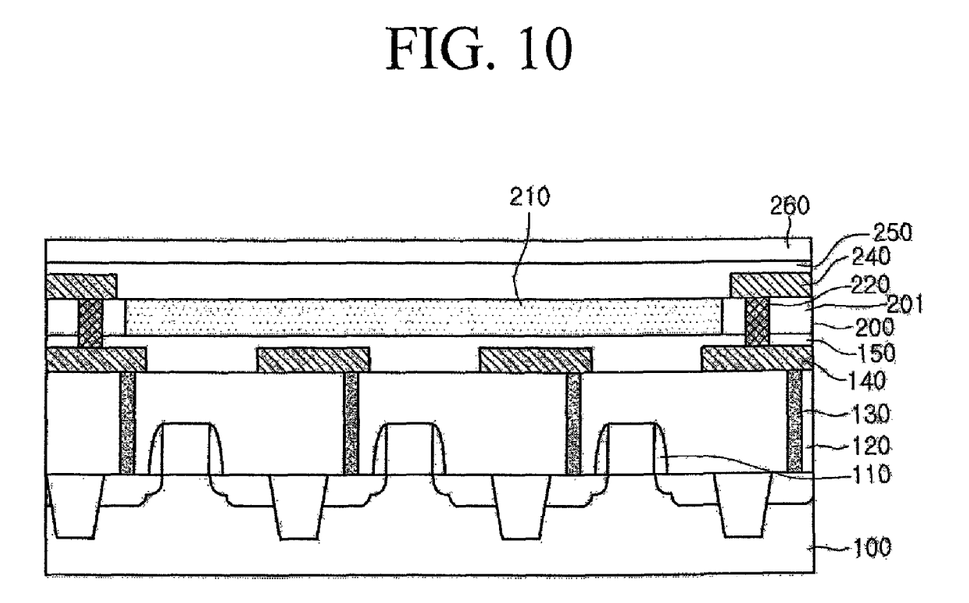

Example FIG. 10 is a sectional view of an image sensor according to embodiments. Referring to example FIG. 10, transistors 110 may be disposed in each unit pixel on and/or over a pixel region of first substrate 100. First substrate 100 may be one of a single crystalline silicon substrate and a substrate doped with p-type or n-type impurities. A device isolation layer, which may define an active region and a field region, may be formed in first substrate 100. This may define a pixel region. Transistors 110 may be disposed in each unit pixel. Transistors 110 may be connected to a photodiode to be described later and may convert received photocharges to an electrical signal. According to embodiments, transistors 110 may include a transfer transistor, a reset transistor, a drive transistor and a select transistor. According to embodiments, the transistors may have any one of 3Tr, 4Tr and 5Tr configuration. According to embodiments, other configurations could be used.

Pre-metal dielectric 120, which may include contact plugs 130, may be disposed on and/or over first substrate 100. Contact plugs 130 may be electrically connected to transistors 110 disposed in each unit pixel. First dielectric 150 may include first metal interconnections 140 and may be disposed on and/or over pre-metal dielectric 120. First metal interconnections 140 may be respectively connected to contact plugs and may deliver photocharges of photodiode 210 to transistors 110. Crystalline semiconductor layer 200, including photodiode 210, may be disposed on and/or over first dielectric 150. According to embodiments, crystalline semiconductor layer 200 may be a single crystal silicon substrate, substantially similar to first substrate 100. According to embodiments, crystalline semiconductor layer 200 may be a p-type substrate.

According to embodiments, photodiode 210 may be disposed in crystalline semiconductor layer 200 such that it corresponds to a pixel region of first substrate 100. Photodiode 210 may be doped with n-type impurities or p-type impurities. Photodiode 210 may have a p-n junction or n-p junction. Photodiode 210 may be separated for each pixel by selectively forming n-type impurity regions in p-type crystalline semiconductor layer 200. Since photodiode 210 may be formed in crystalline semiconductor layer 200 to correspond to a pixel region of first substrate 100, dummy region 201 may be formed in crystalline semiconductor layer 200 in which photodiode 210 may not be formed. Via contact 220 may be disposed in dummy region 201, and may be electrically connected to first metal interconnection 140. Via contact 220 may be formed by filling a metallic material into via hole 205 that may be formed in dummy region 201 and may expose first metal interconnection 140.

Figure 7:
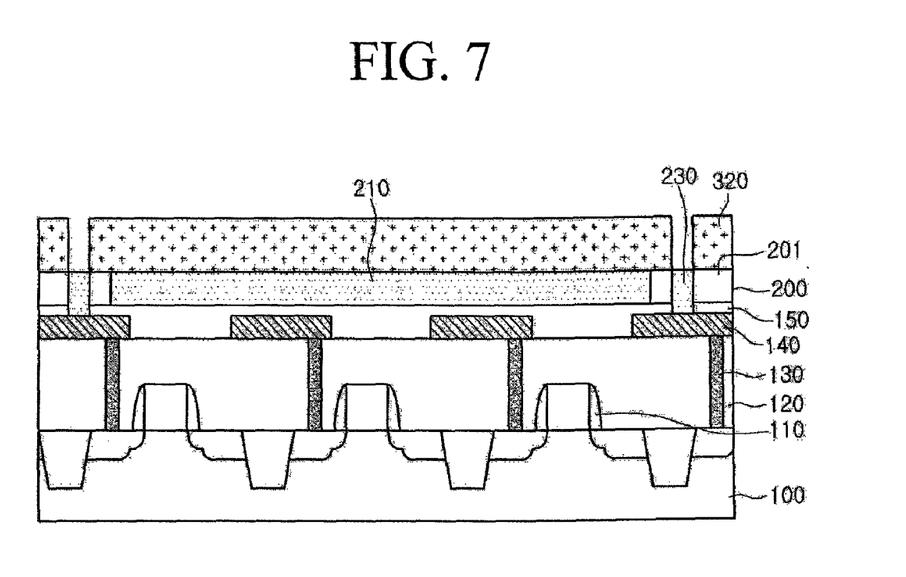

As illustrated in example FIG. 7, via contact 230 may be formed by selectively implanting impurity ions into dummy region 201 and first dielectric 150. Via contact 230 may be connected to first metal interconnection 140. Via contact 230 may be formed using n-type impurities or p-type impurities. Via contact 220 may penetrate dummy region 201 of crystalline semiconductor layer 200, and may be electrically connected to first metal interconnection 140.

Second dielectric 250 may include a plurality of second metal interconnections 240. Second dielectric 250 may be disposed on and/or over crystalline semiconductor layer 200 including via contact 220 and photodiode 210. Second metal interconnection 240 may be disposed on and/or over via contact 220. Second metal interconnection 240 may be connected to photodiode 210 and may deliver photocharges generated in photodiode 210 to transistor 110 through via contact 220 and first metal interconnection 140. Passivation layer 260 may be provided on and/or over second dielectric 250 including second metal interconnection 240.

According to embodiments, an image sensor may be vertically integrated because crystalline semiconductor layer 200, which may include photodiode 210, may be formed on and/or over first substrate 100. An image sensor may decrease defects in a photodiode because a photodiode may be formed in the crystalline semiconductor layer.

Via contact 220, which may deliver photocharges of photodiode 210 to transistor 110, may be formed in crystalline semiconductor layer 200 where photodiode 210 may be formed. This may make it possible to realize a relatively high degree of integration. According to embodiments, it may be possible to achieve a highly integrated device because photodiode 210 may be formed on and/or over first metal interconnection 140.

A method for manufacturing an image sensor will be described with reference to example FIGS. 1 through 10. Referring to example FIG. 1, first dielectric 150 and first metal interconnection 140 may be formed on and/or over a pixel region of first substrate 100. First substrate 100 may be at least one of a single crystalline substrate and a substrate doped with p-type or n-type impurities. A device isolation layer, which may define an active region and a field region, may be formed in first substrate 100. Transistors 110 may be formed in each unit pixel. Transistors 110 may be connected to a photodiode, to be described later, which may convert received photocharges into an electrical signal. Transistors 110 may include a transfer transistor, a reset transistor, a drive transistor, and a select transistor. Transistors 110 may have any one of 3Tr, 4Tr and 5Tr configuration. According to embodiments, other configurations could be used.

Figure 1:
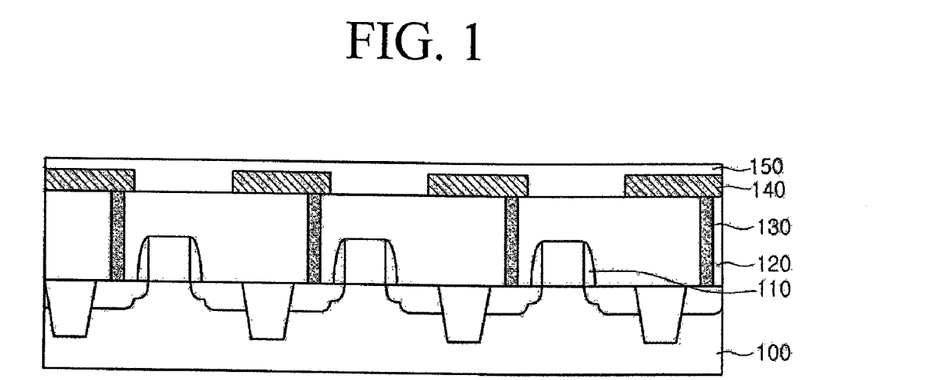
FIGS. 1 through 10 illustrate an image sensor and a method for manufacturing an image sensor, according to embodiments.

Pre-metal dielectric 120, which may include contact plugs 130, may be formed on and/or over first substrate 100. Pre-metal dielectric 120 may be formed of at least one of oxide and nitride. Contact plugs 130 may penetrate pre-metal dielectric 120, and may be respectively connected to transistors 110, which may be formed in each unit pixel. First dielectric 150, which may include first metal interconnections 140, may be formed on and/or over pre-metal dielectric 120, including contact plug 130. First dielectric 150 may be formed of at least one of oxide and nitride. First metal interconnections 140 may be formed on and/or over contact plugs 130, respectively. First metal interconnection 140 may be formed of various conductive materials. First metal connection 140 may be formed of at least one of metal, alloy, and silicide. First metal interconnection may be formed of at least one of aluminum (Al), copper (Cu), cobalt (Co), and tungsten (W). First metal interconnection 140 may be formed in each unit pixel, and may electrically connect transistor 110 to photodiode 210, to be described later. First metal interconnection 140 may deliver photocharges of photodiode 210.

Figure 2:
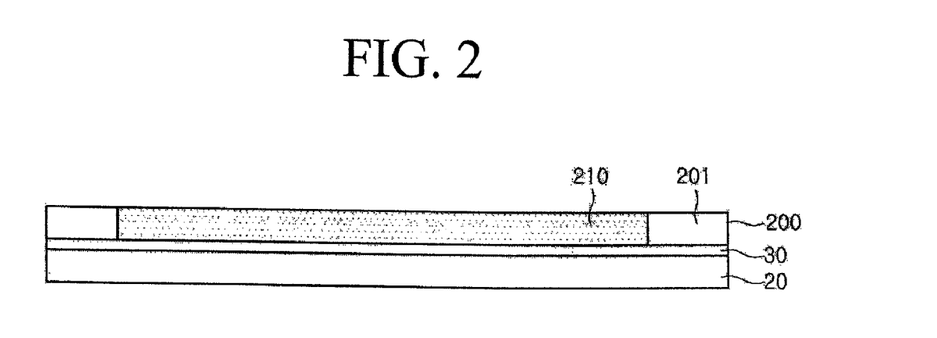

Referring to example FIG. 2, second substrate 20 may be prepared. Second substrate may include crystalline semiconductor layer 200. Second substrate 20 may be a single crystalline or polycrystalline silicon substrate. Second substrate 20 may be a substrate doped with p-type or n-type impurities. Second substrate 20 may have substantially the same area as first substrate 100.

According to embodiments, crystalline semiconductor layer 200 may be formed on and/or over and/or under second substrate 20. Crystalline semiconductor layer 200 may be formed under and/or below second substrate 20. Crystalline semiconductor layer 200 may have a single crystalline or polycrystalline structure. Crystalline semiconductor layer 200 may be a substrate doped with p-type or n-type impurities. Crystalline semiconductor layer 200 may be formed on and/or over second substrate 20. Crystalline semiconductor layer 200 may be a p-type substrate.

Sacrificial layer 30 may be formed at an interface between second substrate 20 and crystalline semiconductor layer 200. Sacrificial layer 30 may be formed by implanting hydrogen ions. According to embodiments, photodiode 210 may be formed in crystalline semiconductor layer 200 on and/or over sacrificial layer 30. Photodiode 210 may be formed in crystalline semiconductor layer 200 and may correspond to a pixel region. Photodiode 210 may include n-type and p-type impurity regions. Photodiode 210 may be formed by implanting impurity ions into crystalline semiconductor layer 200 and may have a p-n junction or n-p junction. An n-type impurity region of photodiode 210 may be formed wider than a p-type impurity region. This may improve a generation of photocharges. Photodiode 210 may be formed by selectively implanting n-type impurity ions into crystalline semiconductor layer 200 of p-type substrate. Photodiode 210 may be formed such that it may be separated for each unit pixel. This may be achieved by separating n-type impurity regions from each other through a selective ion implantation of n-type impurities into a deep region of crystalline semiconductor layer 200 after forming a photoresist pattern. This may selectively expose p-type crystalline semiconductor layer 200.

Photodiode 210 may be formed in crystalline semiconductor layer 200 and may correspond to a pixel region of first substrate 100. Crystalline semiconductor layer 200 excepting a region for photodiode 210 may serve as dummy region 201.

Figure 3:
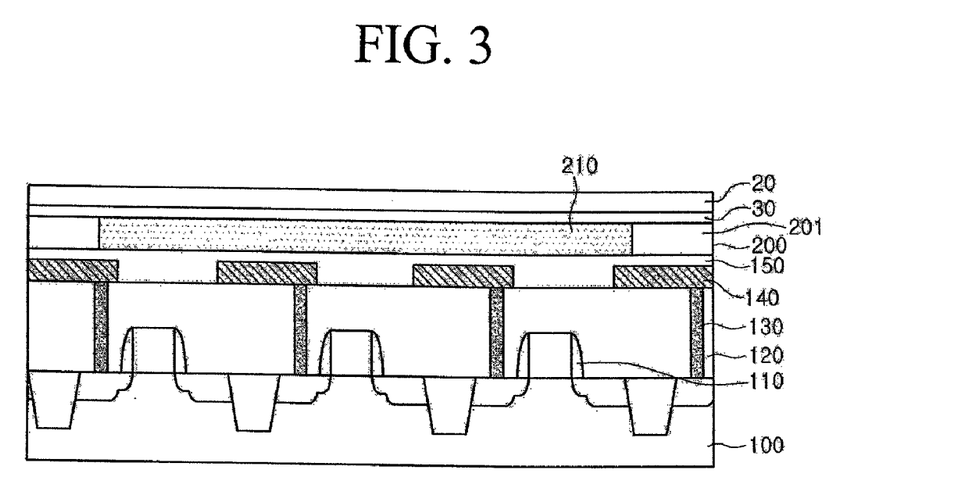

Referring to example FIG. 3, first substrate including transistor 110 may be bonded to second substrate 20 including photodiode 210. First substrate 100 and second substrate 20 may be bonded to each other through a bonding process. A bonding process may be performed by placing a top surface of second substrate 20, which may be a surface of photodiode 210, on and/or over first dielectric 150 of first substrate 100. Crystalline semiconductor layer 200, which may include photodiode 210, may be bonded to first substrate 100. First substrate 100 and crystalline semiconductor layer 200, which may include photodiode 210, may thus have a vertical configuration.

Figure 4:
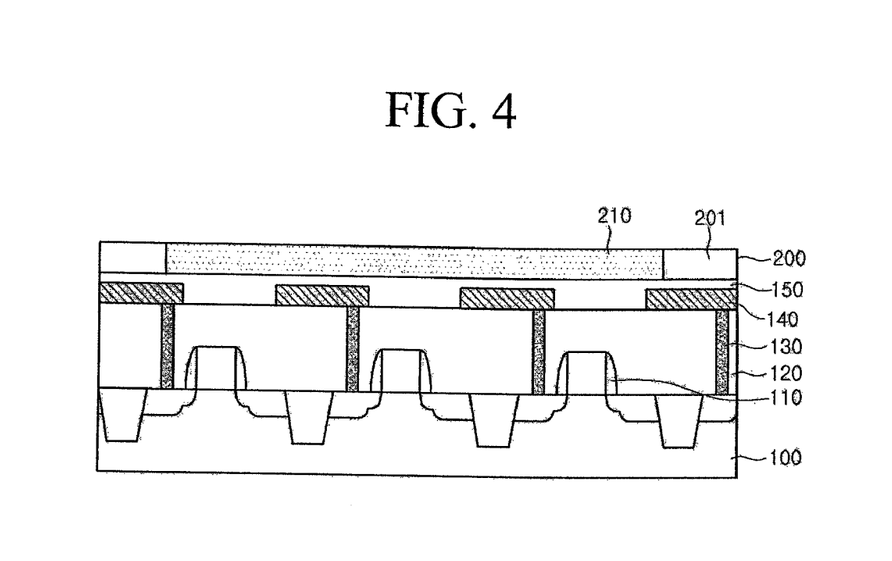

Referring to example FIG. 4, second substrate 20 may be removed. Crystalline semiconductor layer 200 including photodiode 210 and dummy region 201 may remain on and/or over first substrate 100. Since sacrificial layer 30 may be formed between crystalline semiconductor layer 200 and second substrate 20, second substrate 20 may be separated from crystalline semiconductor layer 200. Second substrate 20 may be separated from crystalline semiconductor layer 200 through at least one of a cutting and a cleaving process. Crystalline semiconductor layer 200, which may include photodiode 210 and dummy region 201, may be left on and/or over first substrate 100. A process of forming a via contact may be performed and may connect photodiode 210 to transistor 110 of first substrate 100. A via contact may be formed using a metallic material or impurity region such that it may be connected to first metal interconnection 140. A via contact formed with a metallic material may be first via contact 220, and a via contact formed by an impurity may be second via contact 230.

Figure 5:
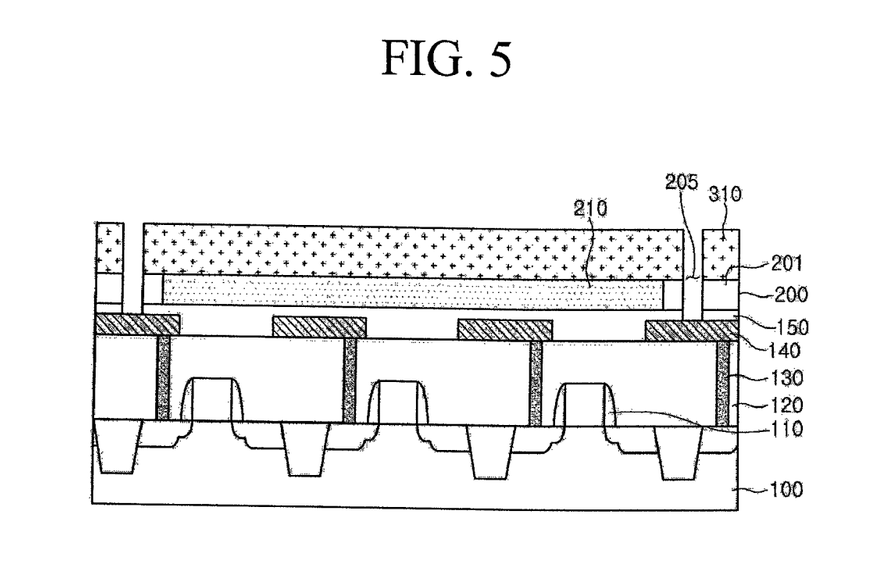

A method of forming first via contact 220 according to embodiments will be described with reference to example FIGS. 5 and 6. Referring to example FIG. 5, via hole 205 may be formed and may penetrate dummy region 201 of crystalline semiconductor layer 200 and first dielectric 150. Dummy region 201 and first dielectric 150 may be selectively removed and may form via hole 205 exposing first metal interconnection 140. To form via hole 205, first photoresist pattern 310 may be formed and may expose a portion of dummy region 201 of crystalline semiconductor layer 200 corresponding to first metal interconnection 140. A hard mask pattern may be formed using an oxide layer instead of first photoresist pattern 310. Dummy region 201 and first dielectric 150 may be etched using first photoresist pattern 310 as an etch mask. Via hole 205 may be formed and may extend through crystalline semiconductor layer 200 and first dielectric 150 and may expose first metal interconnection 140. First photoresist pattern 310 may be removed using ashing technique.

Figure 6:
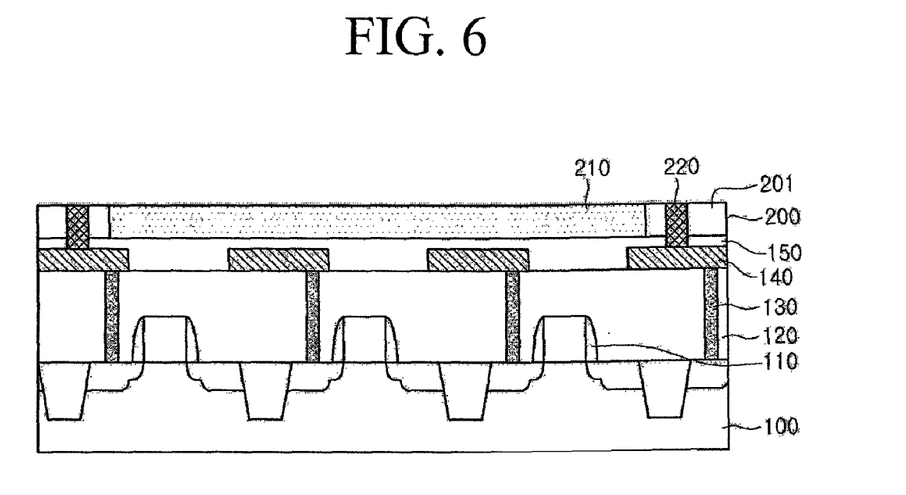

Referring to example FIG. 6, first via contact 220 may be formed in via hole 205. First via contact 220 may be formed by filling a metallic material into via hole 205. First via contact 220 may be formed by depositing various conductive materials, which may include at least one of metal, alloy, and silicide on and/or over crystalline semiconductor layer 220. Chemical mechanical polishing (CMP) may then be performed. First via contact 220 may be formed of at least one of Al, Cu, Co, and W. According to embodiments, other materials could be used. First via contact 220 may be formed in first via hole 205 and may be electrically connected to first metal interconnection 140.

A method of forming second via contact 230 will be described with reference to example FIG. 7. Referring to example FIG. 7, second photoresist pattern 320 may be formed on and/or over crystalline semiconductor layer 200 and may selectively expose dummy region 201 corresponding to first metal interconnection 140. A conductive impurity ion may be implanted into dummy region 201 and first dielectric 150 using second photoresist pattern 320 as an ion implantation mask. An ion implanted into dummy region 201 and first dielectric 150 may be n-type or p-type impurity. Second via contact 230 may thus be formed in dummy region 201 of crystalline semiconductor layer 200 and first dielectric 150 and may be electrically connected to first metal interconnection 140. Since first via contact 220 or second via contact 230 may be formed in dummy region 201 of crystalline semiconductor layer 200 where photodiode 210 may be formed, it may be possible to achieve a relatively high degree of integration of a device.

According to embodiments, an additional process to remove crystalline semiconductor layer 200 except a region for photodiode 210 may be omitted, and thus a manufacturing process may be simplified. Photodiode 210 and dummy region 201 may provide planarized surfaces because dummy region 201 may be formed around photodiode 210. This may make it relatively easy to form a color filter and a microlens during a subsequent process. A trench, which may separate photodiode 210 for each unit pixel, may be formed when forming a via hole for first via contact 220. An ion implantation region, which may separate photodiode 210 for each unit pixel, may be formed during an ion implantation process for forming second via contact 230.

Figure 8:
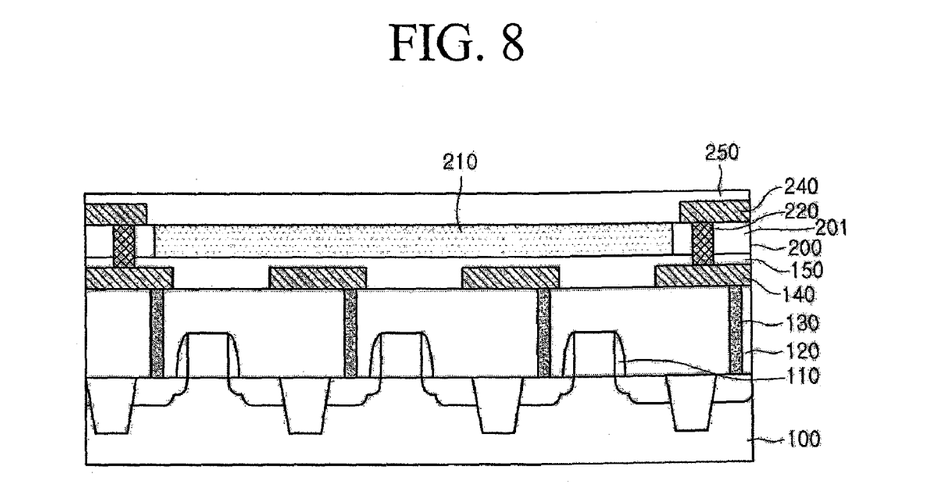

According to embodiments, an exemplary case of using first via contact 220 formed of a metallic material will be described. Referring to example FIG. 8, second dielectric 250, which may include second metal interconnection 240, may be formed on and/or over crystalline semiconductor layer 200 including first via contact 220. Second metal interconnection 240 may be used to connect first via contact 220 and photodiode 210 to each other. Second metal interconnection 240 may be formed of various conductive materials, which may include at least one of metal, alloy, and silicide. Second metal interconnection 240 may be formed of at least one of Al, Cu, Co, and W. Second metal interconnections 240 may be formed such that they may be respectively connected to first via contacts 220. Second metal interconnections 240 may be formed by depositing a metallic material on and/or over crystalline semiconductor layer 200, which may include first via contact 220, and patterning the deposited metallic material. Second metal interconnection 240 may be patterned such that it may be connected to photodiode 210. Photodiode 210 may be connected to second metal interconnection 240.

Figure 9:
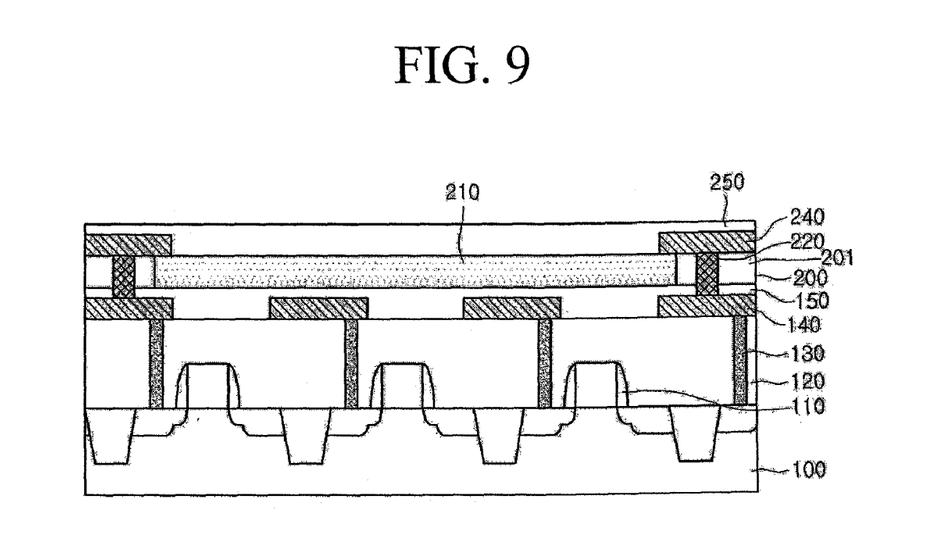

According to embodiments, as illustrated in example FIG. 9, second metal interconnection 240 may be patterned to extend from an upper portion of first via contact 220 to an upper portion of photodiode 210. Second metal interconnection 240 may be connected to a portion of photodiode 210, and may serve as a ground contact of photodiode 210. According to embodiments, photoelectrons generated in photodiode 210 may be delivered to transistor 110 through second metal interconnection 240, first via contact 220, and first metal interconnection 140. Second dielectric 250 may be used to insulate second metal interconnections 240 from each other and may be formed of at least one of oxide and nitride.

Referring to example FIG. 10, passivation layer 260 may be formed on and/or over second dielectric 250 including second metal interconnection 240. Passivation layer 260 may protect a device, including second metal interconnection 240 and photodiode 210. Second metal interconnection 240 may include at least one of an oxide layer, a nitride layer, and a multilayer thereof. A color filter and a microlens may be formed on and/or over passivation layer 260. An image sensor may provide vertical integration by bonding a first substrate including circuitry and a crystalline semiconductor layer including a photodiode. Since a photodiode may be formed on and/or over a first substrate, a focal length of a photodiode may be shortened. This may improve light receiving efficiency. Supplementary on-chip circuitry that may be integrated in accordance with embodiments may increase a performance of an image sensor, downsize a device, and reduce manufacturing cost as well.

According to embodiments, it may be possible to reduce and/or prevent defects in a photodiode because a photodiode may be formed through implanting impurity ions into a single crystalline substrate while employing a vertical type photodiode. A via contact, which may deliver photocharges of a photodiode, may be formed in a crystalline semiconductor layer with a photodiode formed. This may provide for a relatively high level of integration of a device. A photodiode may be formed on and/or over a first metal interconnection that may be connected to a contact plug. It may therefore be possible to realize a relatively high degree of integration of a device. Since a color filter and a microlens may be formed on and/or over a planarized surface, a quality of an image sensor may be improved. A device may be a complementary metal oxide semiconductor (CMOS) image sensor. According to embodiments, a device may be any image sensor requiring a photodiode.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
   at least one transistor over a pixel region of a first substrate;
   a first dielectric over the first substrate, the first dielectric including at least one first metal interconnection connected to the at least one transistor, respectively;
   a crystalline semiconductor layer over the first dielectric;
   a photodiode in the crystalline semiconductor layer formed in a region corresponding to the pixel region;
   a dummy region in the crystalline semiconductor layer excepting the region of the photodiode;
   at least one via contact penetrating the dummy region, and connected to the at least one first metal interconnection, wherein the at least one via contact comprises one of an n-type and a p-type impurity; and
   a second dielectric including at least one second metal interconnection over the crystalline semiconductor layer, wherein the at least one second metal interconnection electrically connects the at least one via contact to the photodiode.

2. The device of claim 1, wherein the photodiode is formed by implanting impurity ions into the crystalline semiconductor layer in the region corresponding to the pixel region.

3. The device of claim 1, wherein the at least one via contact comprises metal.

4. The device of claim 1, wherein the first substrate comprises one of a single crystalline silicon substrate and a substrate doped with at least one of p-type impurities and n-type impurities.

5. The device of claim 4, wherein the crystalline semiconductor layer comprises a p-type layer.

6. The device of claim 1, further comprising a passivation layer over the second dielectric including the at least one via contact.

7. The device of claim 1, wherein the at least one transistor comprises one of a three transistor (3Tr) configuration, a four transistor (4Tr) configuration, and a five transistor (5Tr) configuration.

8. The device of claim 1, wherein each of the at least one first and second metal interconnections comprises at least one of aluminum (Al), copper (Cu), cobalt (Co), and tungsten (W).

9. A method comprising:
   forming a transistor over a pixel region of a first substrate; and then
   forming a first dielectric including a first metal interconnection over the first substrate, the first metal interconnection being connected to the transistor; and then
   forming a crystalline semiconductor layer over the first dielectric; and then
   selectively implanting impurity ions into the crystalline semiconductor layer to form a photodiode in a first portion of the crystalline semiconductor layer corresponding to the pixel region, and to form a dummy region in a second portion of the crystalline semiconductor layer not corresponding to the pixel region; and then
   forming a photoresist pattern over the crystalline semiconductor layer, the photoresist pattern exposing the dummy region corresponding to the first metal interconnection; and then
   implanting conductive impurities into the dummy region and the first dielectric using the photoresist pattern as an ion implantation mask to form a via contact that penetrates the dummy region and is connected to the first metal interconnection; and then
   forming a second dielectric including a second metal interconnection over the crystalline semiconductor layer, the second metal interconnection electrically connecting the via contact to the photodiode.

10. The method of claim 9, wherein forming the crystalline semiconductor layer comprises:
    preparing a second substrate including a crystalline semiconductor layer; and then
    bonding the first and second substrates to each other; and then
    separating the second substrate from the crystalline semiconductor layer to leave the crystalline semiconductor layer remaining over the first substrate.

11. The method of claim 10, wherein the crystalline semiconductor layer comprises a p-type layer.

12. The method of claim 9, wherein forming the via contact comprises:
    forming a photoresist pattern over the crystalline semiconductor layer, the photoresist pattern selectively exposing the dummy region corresponding to the first metal interconnection; and then
    selectively etching the dummy region and the first dielectric using the photoresist pattern as an etch mask to form a via hole exposing the first metal interconnections; and then
    depositing a metallic material in the via hole.

13. The method of claim 12, wherein the metallic material comprises at least one of aluminum (Al), copper (Cu), cobalt (Co), and tungsten (W).

14. The method of claim 9, wherein the conductive impurity comprises one of an n-type impurity and a p-type impurity.

15. The method of claim 9, further comprising forming a passivation layer over the second dielectric including the second metal interconnection.

16. The method of claim 9, wherein the photodiode is formed by implanting impurities into the first portion of the crystalline semiconductor layer to form one of a p-n junction and an n-p junction.

17. The method of claim 9, wherein forming the transistor comprises forming at least one of a three transistor (3Tr) configuration, a four transistor (4Tr) configuration, and a five transistor (5Tr) configuration.

18. The method of claim 9, wherein the first substrate comprises one of a single crystalline silicon substrate and a substrate doped with at least one of p-type impurities and n-type impurities.

* * * * *